(12) United States Patent
Trimberger et al.

(10) Patent No.: US 7,979,827 B1
(45) Date of Patent: Jul. 12, 2011

(54) DEVICE HAVING PROGRAMMABLE RESOURCES AND A METHOD OF CONFIGURING A DEVICE HAVING PROGRAMMABLE RESOURCES

(75) Inventors: Stephen M. Trimberger, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 485 days.

(21) Appl. No.: 12/042,527

(22) Filed: Mar. 5, 2008

(51) Int. Cl.
*G06F 17/50* (2006.01)

(52) U.S. Cl. ........................................... 716/117

(58) Field of Classification Search ............. 716/16, 716/17, 117
See application file for complete search history.

(56) References Cited

U.S. PATENT DOCUMENTS

| | | | |
|---|---|---|---|
| 5,748,979 A | | 5/1998 | Trimberger |
| 5,815,405 A | * | 9/1998 | Baxter .............. 716/3 |
| 5,968,161 A | | 10/1999 | Southgate |
| 6,078,735 A | * | 6/2000 | Baxter .............. 716/3 |
| 6,078,736 A | * | 6/2000 | Guccione ........... 716/16 |
| 6,311,316 B1 | * | 10/2001 | Huggins et al. ........... 716/12 |
| 6,625,787 B1 | * | 9/2003 | Baxter et al. ........... 716/113 |
| 6,725,441 B1 | * | 4/2004 | Keller et al. ........... 716/16 |
| 6,894,527 B1 | * | 5/2005 | Donlin et al. ........... 326/8 |
| 6,938,236 B1 | * | 8/2005 | Park et al. .......... 716/17 |
| 7,111,224 B1 | | 9/2006 | Trimberger |
| 7,207,020 B1 | * | 4/2007 | Fung et al. ........... 716/6 |
| 7,251,804 B1 | | 7/2007 | Trimberger |
| 7,284,229 B1 | | 10/2007 | Trimberger |
| 7,310,794 B1 | | 12/2007 | Squires |
| 7,315,972 B1 | * | 1/2008 | Bapat ............. 714/741 |
| 7,417,918 B1 | * | 8/2008 | Hao et al. .......... 365/233.12 |
| 7,610,573 B1 | * | 10/2009 | Chan et al. .......... 716/104 |

OTHER PUBLICATIONS

Goldstein, Seth Copen et al., "PipeRench: A Reconfigurable Architecture and Compiler," *Computer*, Apr. 2000, pp. 70-77, vol. 33, Issue 4.
Matsumoto, Yohei et al., "Performance and Yield Enhancement of FPGAs with Within-die Variation using Multiple Configurations," *Proceedings of the 2007 ACM/SIGDA 15th International Symposium on Field Programmable Gate Arrays (FPGA'07)*, Feb. 18-20, 2007, pp. 169-177, Monterey, California, USA.
Sedcole, Pete et al., "Parametric Yield in FPGAs Due to Within-die Delay Variations: A Quantitative Analysis," *Proceedings of the 2007 ACM/SIGDA 15th International Symposium on Field Programmable Gate Arrays (FPGA'07)*, Feb. 18-20, 2007, pp. 178-187, Monterey, California, USA.

* cited by examiner

*Primary Examiner* — Jack Chiang
*Assistant Examiner* — Brandon W Bowers
(74) *Attorney, Agent, or Firm* — John J. King; LeRoy D. Maunu

(57) ABSTRACT

A method of configuring a device having programmable logic is disclosed. The method comprises generating a netlist associated with a circuit design; coupling the netlist to the device having programmable logic; performing a re-targeting function using a circuit on the device having programmable logic; generating configuration bits for configuring the programmable logic; and configuring the programmable logic to implement the circuit design according to the configuration bits based upon the netlist and results of the re-targeting function.

16 Claims, 8 Drawing Sheets

DEVICE HAVING PROGRAMMABLE RESOURCES AND A METHOD OF CONFIGURING A DEVICE HAVING PROGRAMMABLE RESOURCES

FIELD OF THE INVENTION

The present invention relates generally to integrated circuits, and in particular, to device having programmable logic and a method of configuring a device having programmable logic.

BACKGROUND OF THE INVENTION

Integrated circuits are an integral part of any electronic device. A variety of integrated circuits are often used together to enable the operation of the electronic device. While integrated circuits are typically designed for a particular application, one type of integrated circuit which enables flexibility is a programmable logic device (PLD). A programmable logic device is designed to be user-programmable so that users may implement logic designs of their choices. One type of programmable logic device is the Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., FLASH memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block.

While PLDs provide many advantages, configuration bitstreams for programming logic may not be compatible between different devices having programmable logic. That is, a configuration bitstream may not be interchangeably used between different programmable logic devices, or even different models of a given programmable logic device. For example, a given configuration bitstream for a Virtex-II device may not be used in a Virtex 4 device, both available from Xilinx, Inc. of San Jose, Calif. Further, a given configuration bitstream may not be used between different models of a Virtex-II device, for example, or different models of a Virtex 4 device. In addition to delays as result of the need to generate separate bitstreams for different devices, there is an additional cost involved generating the additional bitstreams. Further, the need to generate different bitstreams may prevent or delay users from migrating to newer devices of a manufacturer, thereby impacting the performance of the manufacturers.

Accordingly, there is a need for a method of configuring a device having programmable logic which enables a representation of the design to be used in different devices.

SUMMARY OF THE INVENTION

A method of configuring a device having programmable logic is disclosed. The method comprises generating a netlist associated with a circuit design; coupling the netlist to the device having programmable logic; performing a re-targeting function using a circuit on the device having programmable logic; generating configuration bits for configuring the programmable logic; and configuring the programmable logic to implement the circuit design according to the configuration bits based upon the netlist and results of the re-targeting function.

According to an alternate embodiment, a method of configuring a device having programmable logic comprises performing a an initial targeting function for a circuit design; generating a netlist associated with the circuit design based upon the initial targeting function; coupling the netlist to the device having programmable logic; performing a re-targeting function using a circuit on the device having programmable logic; and configuring the programmable logic to implement the circuit design based upon the netlist and the results of the re-targeting function.

A device having programmable logic is also disclosed. The device comprises an input/output port coupled to receive a netlist associated with the circuit design; a plurality of logic blocks; and a targeting circuit coupled to the input/output port to receive the netlist for implementing a circuit design in the plurality of logic blocks, wherein the circuit design is implemented using the programmable logic according to configuration bits based upon the netlist.

DETAILED DESCRIPTION

Figure 1:
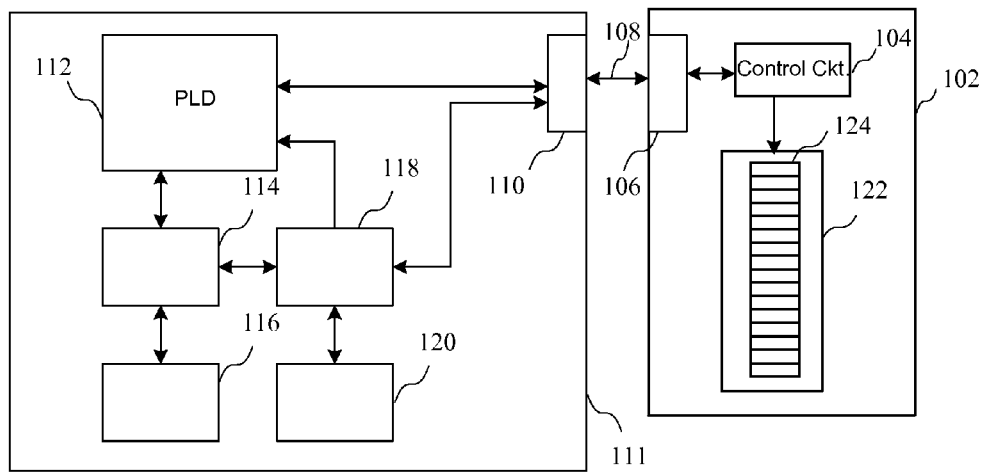
FIG. 1 is a block diagram of a system for configuring a device having programmable logic according to an embodiment of the present invention.

Turning now to FIG. 1, a block diagram of a system for configuring a device having programmable logic according to an embodiment of the present invention is shown. In particular, a computer 102 comprises a control circuit 104 coupled from an input/output port 106 by way of a communication link 108 to a input/output port 110 of a circuit board 111 having a programmable logic device 112. The programmable logic device is coupled to other integrated circuits or other devices 114-120, directed or indirectly. Some devices, such as device 118, may also be directly coupled to the input/output port 110. Device 118 may be a non-volatile memory for storing a configuration bitstream downloaded to the system. Input/output signals are provided to the programmable logic device 112 and other devices. As shown in FIG. 1, control circuit 104 is coupled a memory 122 having a file 124. The file represents a circuit design to be implemented by the PLD 112. The computer 102 may be any type computer, where the control circuit may be a processor running software for generating a netlist and additional information which will be described in more detail below.

The additional information may be provided with the netlist to enable the implementation of the design in a variety of different devices having programmable logic. The information included with the netlist coupled to the PLD may vary depending upon a number of factors, including the variety of devices which may use the netlist and considerations related to implementing a placement and routing tool within the PLD. For example, different information provided with the netlist may vary depending upon whether a user intends the netlist to be used by any type of PLD, or only PLDs in a given family. The additional information may include timing information related to nets or paths, location information for placement, or routing information for particular nets or paths. Further, the specific information provided with the netlist may be used differently by the PLD, depending upon the type of PLD implementing the netlist, or the type of PLD in which the netlist was originally implemented.

In addition to providing specific information related to various nets or paths which may be used by PLD, general information may also be included with the netlist, and used by the PLD. For example, the type of device for which the netlist was originally designed may be included, enabling the PLD to use that information alone to re-target the design to the device. For example, if the PLD is from the same family as the device for which the netlist was originally generated, the PLD may be able to re-target the design more easily by placing and routing various nets or paths using similar resources in the PLD. That is, the placement and routing tool of the PLD may use X-Y location information for various resources associated with one device to place and route certain nets or paths in resources at similar X-Y locations. In certain circumstances, the information indicating the type of device for which the netlist was originally placed and routed may be used by the PLD. For example, while the design may have been originally placed and routed on a PLD having 6-input lookup tables (LUTs), the PLD using the netlist and information may have 4-input LUTs. Accordingly, the place and route tool of the PLD may still use the location information provided with the netlist, but may take into account whether a given LUT in the original design used 4 or fewer inputs. For example, if only 4 inputs of a given 6-input LUT were used in the original PLD, that LUT could be directly mapped to a 4-input LUT of the PLD. However, a 6-input LUT using all of the inputs would have to be mapped to two or more LUTs of the PLD.

Further, while the information with the netlist may be the same regardless of the PLD on which a netlist was originally placed and routed, the information may be used differently depending upon the PLD for which the information relates and the PLD which is to implement the design. That is, certain information may be important for some PLDs, while other information may not be useful, depending upon the PLD using the information. For example, timing information related to a design implemented in a given family may be used by a PLD of a different family to perform placement and routing because the PLD using the timing information knows its own timing characteristics. Alternatively, timing information may not be necessary for a PLD of the same family if placement and routing information is included with the netlist. That is, the PLD would perform placement and routing for various nets and paths based on placement and routing information by using similar resources in the PLD. Therefore, while the information included with the netlist may vary depending upon the devices for which of the user may desire to create a compatible bitstream, the information that is included may be used differently. While a PLD is shown by way of example in FIG. 1, PLD 112 could be any type of device having programmable logic, such as an application specific integrated circuit (ASIC) having a portion which comprises programmable logic.

Figure 2:
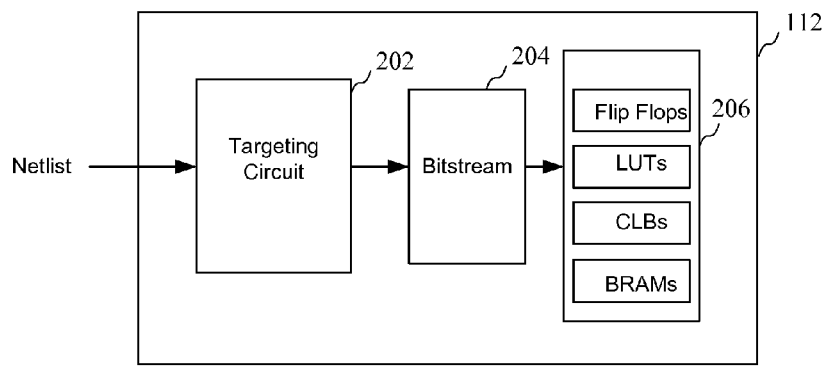
FIG. 2 is a block diagram of a device having programmable logic according to an embodiment of the present invention.

Turning now to FIG. 2, a block diagram of a device having programmable logic according to an embodiment of the present invention is shown. The programmable logic device 112 comprises a targeting circuit 202 which generates a bitstream 204 used to configure logic elements 206 of the device. The configurable logic elements shown in FIG. 2 are flip flops, LUTs, CLBs and blocks of random access memory (BRAMs). As will be described in more detail below, the configurable logic elements are common to devices for which a netlist and other information may be used to generate a configuration bitstream. The targeting circuit 202 may be implemented in special-purpose hardware, in programmable logic configured by a bootstrap configuration prepended to the design data, or by a processor of the device. Place and route tools may be implemented within the programmable logic device in the same manner as they are implemented outside the PLD. However, the requirements of the targeting circuit implementing placement and/or routing functions of the PLDs may vary depending upon the amount of placement and routing that is necessary. That is, because some placement and routing may be performed outside of the PLD to generate the netlist and associated information, the amount of placement and routing performed by the targeting circuit may vary. Depending upon resources of the PLD and the level of placement and routing which is necessary, the place and route tools may be implemented in the PLD using different resources of the PLD. For example, the place and routing tool may be implemented by a dedicated processor of the PLD, such as a Power PC processor on the PLD, or a soft processor, such as MicroBlaze processor implemented in configurable logic of the PLD, both of which are available from Xilinx, Inc. Alternatively, the place and route tool may be implemented in a combination of a processor and hardware, including fixed hardware and/or programmable hardware. By way of example, the bitstream may be generated using configuration software, such as ISE Foundation software, available from Xilinx, Inc. of San Jose, Calif., or some other suitable configuration software. A more detailed arrangement of circuits for implementing the blocks in FIG. 2 will be described in more detail in reference to FIG. 3.

As will be described in more detail below, the targeting circuit 202 may be used to perform any of a number of functions for generating a bitstream. The basic steps of forming a bitstream include mapping, packing, placing and routing, which are well known in the art. The targeting circuit in the device having programmable logic may perform any steps. However, because of the time required for performing mapping, packing and placing of the circuit, one benefit of the circuits and methods of the present invention is that additional information provided with a netlist enables the use of location or timing information to perform a simplified placement function and routing function. That is, the requirements of the targeting circuit on the device are significantly minimized by limiting the placement and routing functions to simple placement functions and/or simple routing functions. By performing an initial targeting function to generate placement and routing information which may be used by the targeting circuit in a device receiving a netlist and additional information, a netlist for a given design may be used by different devices, enabling easier transitioning by users from one device to another.

Figure 3:
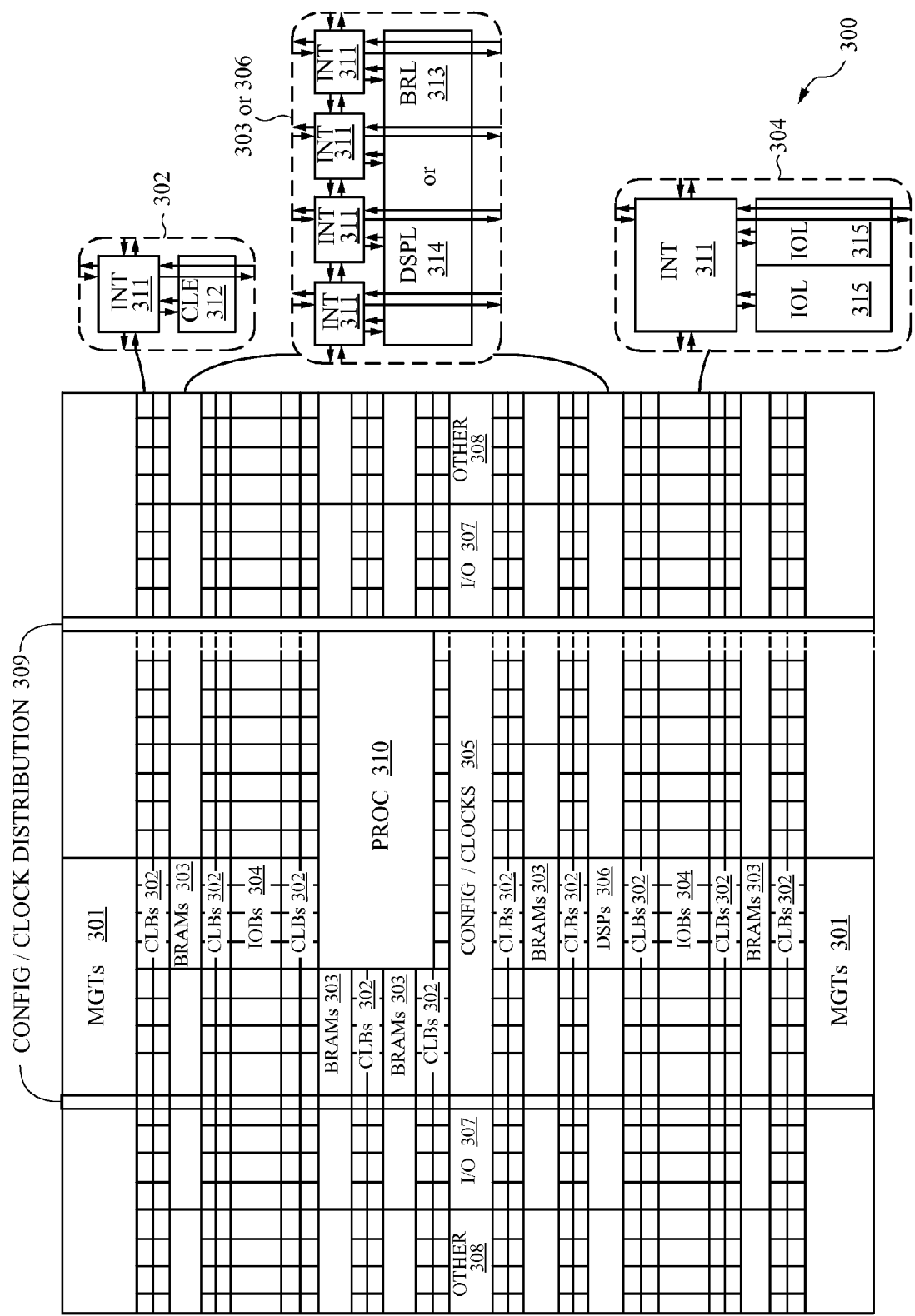
FIG. 3 is a more detailed block diagram of a device having programmable logic according to an embodiment of the present invention.

Turning now to FIG. 3, a more detailed block diagram of a device having programmable logic according to an embodiment of the present invention is shown. For example, FIG. 3 illustrates an FPGA architecture that includes a large number of different programmable tiles comprising programmable logic including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 may include a configurable logic element (CLE 312) that may be programmed to implement user logic plus a single programmable interconnect element (INT 311). A BRAM 303 may include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 306 may include a DSP logic element (DSPL 314) in addition to an appropriate number of programmable interconnect elements. An IOB 304 may include, for example, two instances of an input/output logic element (IOL 315) in addition to one instance of the programmable interconnect element (INT 311). As will be clear to those of skill in the art, the actual I/O pads connected, for example, to the I/O logic element 315 typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks may be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. As set forth above, the targeting circuit 202 of FIG. 2 may be implemented in the various resources of FIG. 3, depending upon various factors, including available resources of the PLD and the requirements of the placing and routing function.

Figure 4:
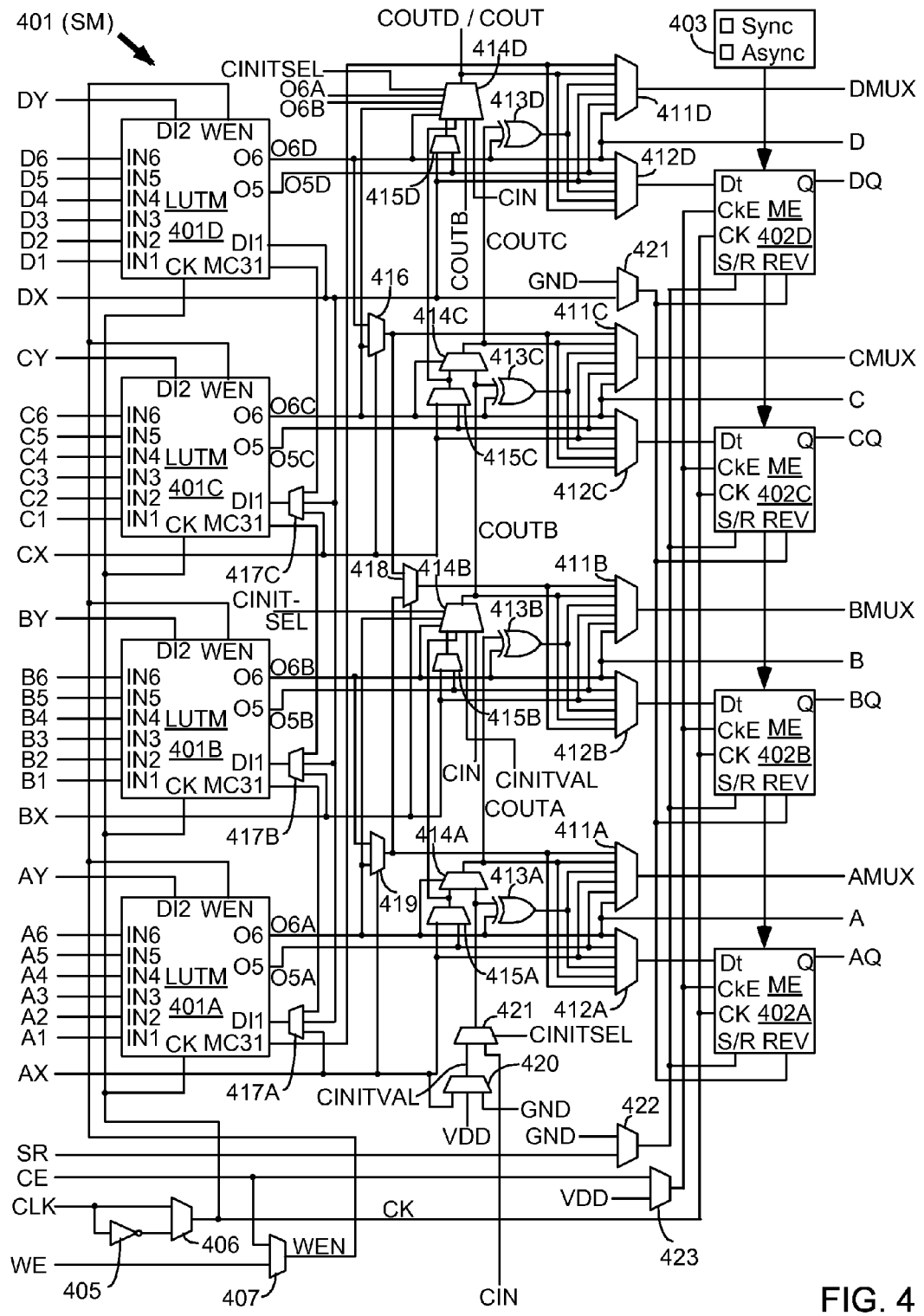
FIG. 4 is a block diagram of a configurable logic element of the device of FIG. 3 according to an embodiment of the present invention.

Turning now to FIG. 4, a block diagram of a configurable logic element of the device of FIG. 3 according to an embodiment of the present invention is shown. In particular, FIG. 4 illustrates in simplified form a configurable logic element of a configuration logic block 302 of FIG. 3. In the embodiment of FIG. 4, slice M 401 includes four lookup tables (LUTMs) 401A-401D, each driven by six LUT data input terminals A1-A6, B1-B6, C1-C6, and D1-D6 and each providing two LUT output signals O5 and O6. The O6 output terminals from LUTs 401A-401D drive slice output terminals A-D, respectively. The LUT data input signals are supplied by the FPGA interconnect structure via input multiplexers, which may be implemented by programmable interconnect element 411, and the LUT output signals are also supplied to the interconnect structure. Slice M also includes: output select multiplexers 411A-411D driving output terminals AMUX-DMUX; multiplexers 412A-412D driving the data input terminals of memory elements 402A-402D; combinational multiplexers 416, 418, and 419; bounce multiplexer circuits 422-423; a circuit represented by inverter 405 and multiplexer 806 (which together provide an optional inversion on the input clock path); and carry logic comprising multiplexers 414A-414D, 415A-415D, 420-421 and exclusive OR gates 413A-413D. All of these elements are coupled together as shown in FIG. 4. Where select inputs are not shown for the multiplexers illustrated in FIG. 4, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 4 for clarity, as well as from other selected figures herein.

In the pictured embodiment, each memory element 402A-402D may be programmed to function as a synchronous or asynchronous flip-flop or latch. The selection between synchronous and asynchronous functionality is made for all four memory elements in a slice by programming Sync/Asynch selection circuit 403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 402A-402D are clocked by a clock signal CK, which may be provided by a global clock network or by the interconnect structure, for example. Such programmable memory elements are well known in the art of FPGA design. Each memory element 402A-402D provides a registered output signal AQ-DQ to the interconnect structure. Because each LUT 401A-401D provides two output signals, O5 and O6, the LUT may be configured to function as two 5-input LUTs with five shared input signals (IN1-IN5), or as one 6-input LUT having input signals IN1-IN6.

In the embodiment of FIG. 4, each LUTM 401A-401D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 417A-417C for LUTs 401A-401C), or to the two 32-bit RAMs via input terminals DI1 and DI2. RAM write operations in the LUT RAMs are controlled by clock signal CK from multiplexer 406 and by write enable signal WEN from multiplexer 407, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 401A may also be provided to the general interconnect structure for shift register chaining, via output select multiplexer 411D and CLE output terminal DMUX. The devices having programmable logic and methods of the present invention may be implemented according to the device of FIGS. 3 and 4, or in any device, including any type of integrated circuit having programmable logic.

Figure 5:
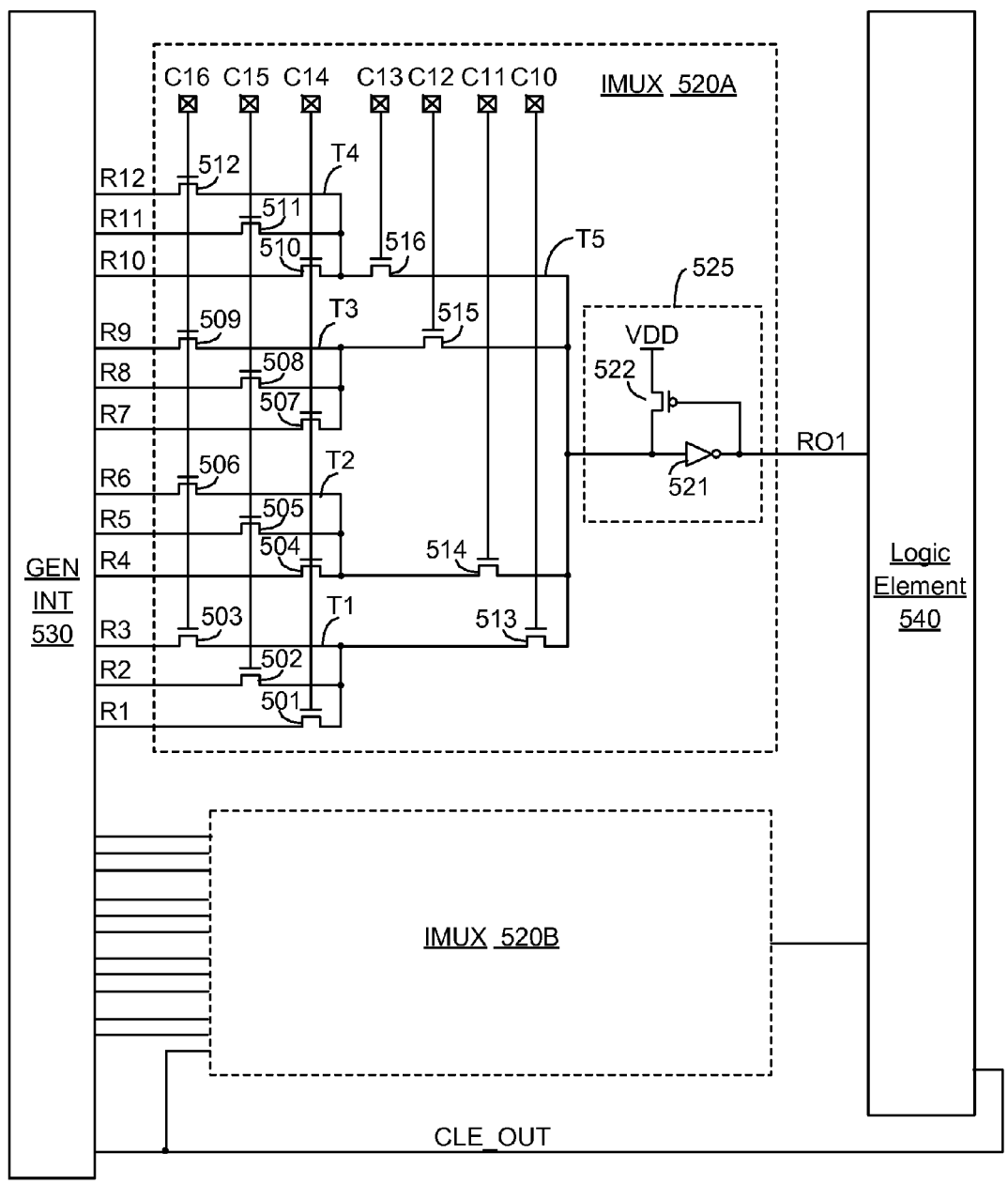
FIG. 5 is a block diagram of interconnect logic of the device of FIG. 3 according to an embodiment of the present invention.

Turning now to FIG. 5, a block diagram of interconnect logic of the device of FIG. 3 according to an embodiment of the present invention is shown. In particular, FIG. 5 illustrates how a programmable input multiplexer may be used to provide additional routing flexibility between the general interconnect structure and a configurable logic element, wherein longer paths may be created in the general interconnect structure to meet timing requirements. An input multiplexer provides the ability to select one of many different interconnect lines to provide a signal to a CLE input terminal. An input multiplexer may be implemented, for example, as shown in FIG. 5. The illustrated circuit selects one of several different input signals and passes the selected signal to an output terminal. Note that FIG. 5 illustrates an input multiplexer with twelve inputs, but programmable logic device input multiplexers typically have many more inputs, e.g., 20, 24, 28, 30, 36, or some other number. However, FIG. 5 illustrates a smaller circuit, for clarity.

The circuit of FIG. 5 includes twelve input terminals R1-R12 and sixteen pass gates 501-516. Pass gates 501-503 selectively pass one of input signals R1-R3, respectively, to a first internal node T1. Each pass gate 501-503 has a gate terminal driven by a configuration memory cell C14-C16, respectively. Similarly, pass gates 504-506 selectively pass one of input signals R4-R6, respectively, to a second internal node T2. Each pass gate 504-506 has a gate terminal driven by one of the same configuration memory cells C14-C16, respectively. From internal nodes T1, T2, pass gates 513, 514 are controlled by configuration memory cells C10, C11, respectively, to selectively pass at most one signal to another internal node T5. Pass gates 507-512 and 515-516 are similarly controlled by configuration memory cells C12-C16 to select one of input signals R7-R12 and to pass the selected input signal via one of internal nodes T3, T4 to internal node T5, as shown in FIG. 5. The signal on internal node T5 is pulled up by structure 525 to provide a full swing output signal RO1. Buffer 525 includes an inverter 521 and a pull-up (e.g., a P-channel transistor 522 to power high VDD) on internal node T5 and driven by the output of inverter 521. Thus, values stored in configuration memory cells C10-C16 select at most one of the input signals R1-R12 to be passed to internal node T5, and hence to output node RO1. If none of the input signals is selected, output signal RO1 may be held at a low value by pull-up 522. The interconnect logic of FIG. 5 and other interconnect elements of the general interconnect structure 530 may be used to adjust the delay time of the nets to meet the minimum timing requirement.

Figure 6:
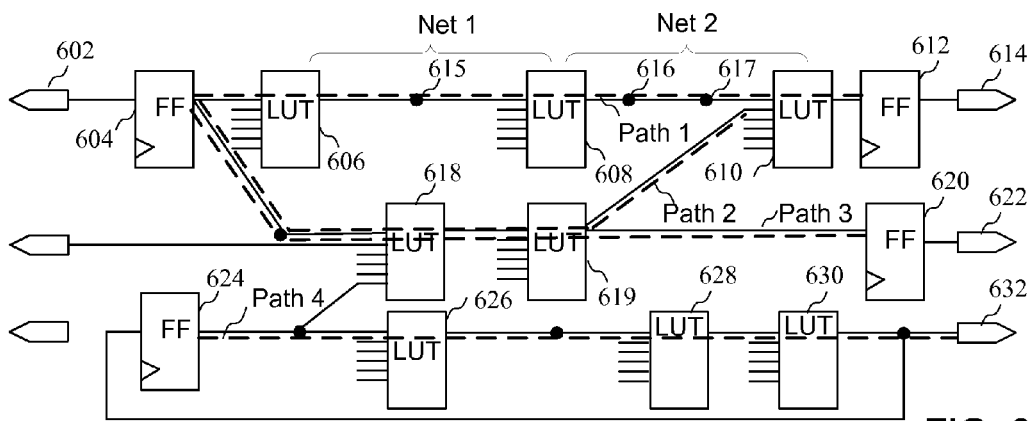
FIG. 6 is a block diagram showing an example of nets and paths in a device having programmable logic according to an embodiment of the present invention.

Turning now to FIG. 6, a block diagram shows an example of nets and paths in a device having programmable logic according to an embodiment of the present invention. As will be described in more detail below, the timing constraints may be based upon nets or paths, for example. A net represents a collection of interconnect lines from the output of a user logic block to inputs of the next destination block, while a path represents a sequence of nets between registers comprising a connection from a source to a specific destination. A path may be defined as a clock to clock path, such as one register to another register, a register to an output, an input to a register, or an input to an output, as is well known in the art.

In particular, an input/output (I/O) port 602, which may comprise a primary input, is coupled to an input of a register 604, shown here as a flip-flop, the output of which is coupled to an input of a LUT 606. Some inputs of LUTs and FFs in FIG. 6 are shown without nets attached. These nets may connect to other nets, LUTs or FFs, but are not shown for clarity. The output of the LUT 606 is coupled to a second LUT 608, the output of which is coupled to a third LUT 610. The output of the LUT 610 is coupled to a register 612 which is coupled to an I/O port 614. I/O port 614 may comprise a primary output. By way of example, a first path extends from the register 604 to a register 612 by way of LUT 606, LUT 608, and LUT 610. Also shown by way of example, a first net (Net1) is defined between LUT 606 and LUT 608, and comprises one interconnect point 615 connecting two interconnect wire segments. The interconnect point may comprise a programmable interconnect point (PIP). For example, the interconnect point could comprise a programmable multiplexing network similar to the multiplexing network 520A of FIG. 5, for example, or some other suitable multiplexing network. In contrast, a second net (Net2) extending from the LUT 608 to the LUT 610 comprises two interconnect points 616 and 617 connecting interconnect wire segments. As described above, the connection from the output of one LUT to the input of another LUT may be established by a number of different nets which may comprise different delays and may be selected to comprise a desired delay or meet a minimum delay. A second path, path 2, between the register 604 and the register 612 is shown extending through LUTs 618 and 619, and back to LUT 610. A third path extends from register 604 through LUTs 618 and 619 to register 620, the output of which is coupled to an I/O port 622. The output of a register 624 is coupled by way of LUTs 626-630 to an I/O port 632, as shown by path 4. A feedback loop is also shown, which would be considered a separate path. The interconnect multiplexers of FIG. 5 may be used to provide input flexibility between a general interconnect structure and configurable logic elements in FIG. 6 and enable adjusting nets to meet a timing constraints. The embodiment of FIG. 6 is merely provided by way of example to show nets and paths in programmable logic of a programmable logic device. However, it should be understood that the nets may include many additional interconnect segments and interconnect points, while the paths may include many additional LUTs and registers.

Figure 7:
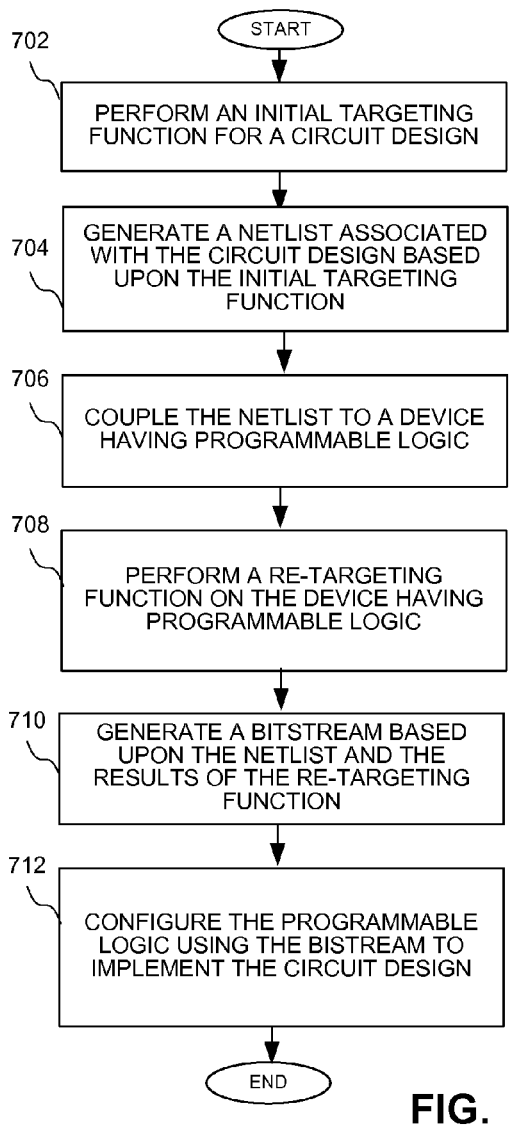
FIG. 7 is a flow chart showing a method of configuring a device having programmable logic according to an embodiment the present invention.

Turning now to FIG. 7, a flow chart shows a method of configuring a device having programmable logic according to an embodiment the present invention. According to one aspect of a method of the present invention, an initial targeting function is performed, where a netlist is generated, along with information related to the netlist. Accordingly, an initial targeting function is performed for a circuit design at a step 702. A netlist associated with the circuit design is generated based upon the initial targeting function at a step 704. The netlist generated during the preliminary placement and routing function for a circuit may comprise an annotated netlist, where the annotations may provide timing information, general location information, or more specific placement information and routing information as described above. The netlist is coupled to the device having programmable logic at a step 706, where a re-targeting function is performed for the circuit design on the device having programmable logic at a step 708. A configuration bitstream, for example, may be generated by the place and route tool of the device based upon the netlist and the results of the re-targeting function at a step 710. The programmable logic is then configured to implement the circuit design based upon the netlist and any other information provided to the place and route tool of the device at a step 712. According, two phases of targeting, including placement and/or routing, enable a netlist associated with a given device to be easily modified to generate a configuration bitstream for another device.

Figure 8:
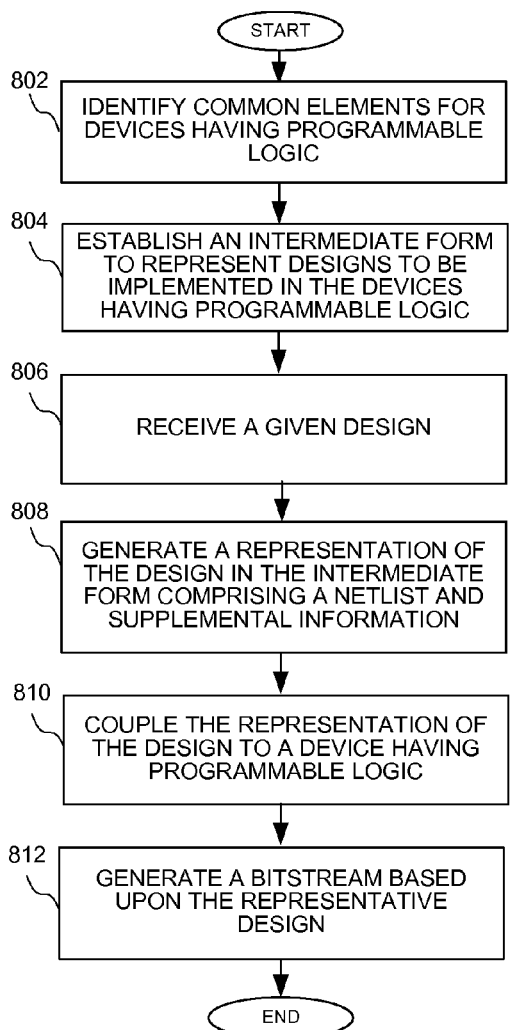
FIG. 8 is a flow chart showing a method of generating a netlist according to an embodiment the present invention.

According to another aspect of the invention, various steps may be implemented to generate the netlist and associated information. In particular, the flow chart of FIG. 8 shows a method of generating a netlist to be provided to a device having programmable logic. In order to enable a netlist to be used by different devices having programmable logic, common elements for the devices having programmable logic are identified at a step 802. For example, the netlist may be defined in terms of elements which are common in different devices, such as the flip flops, LUTs, CLBs and BRAMs which are shown by way of example in FIG. 2. An intermediate form is established to represent designs to be implemented in the device having programmable logic at a step 804. That is, the intermediate form may comprise a netlist defining connections associated with the common elements defined in the step 802, and other information related to the netlist. For example, the other information may comprise location information or timing information for certain nets or paths. The other information may be any information which enables the netlist to be implemented in a device, as described above. After a given design is received at a step 806, a representation of the design is generated in the intermediate form comprising at least a netlist and possibly supplemental information at a step 808. The netlist and any other information are coupled to the device having programmable logic at a step 810. Finally, a bitstream based upon the representative design is generated at a step 812.

Figure 9:
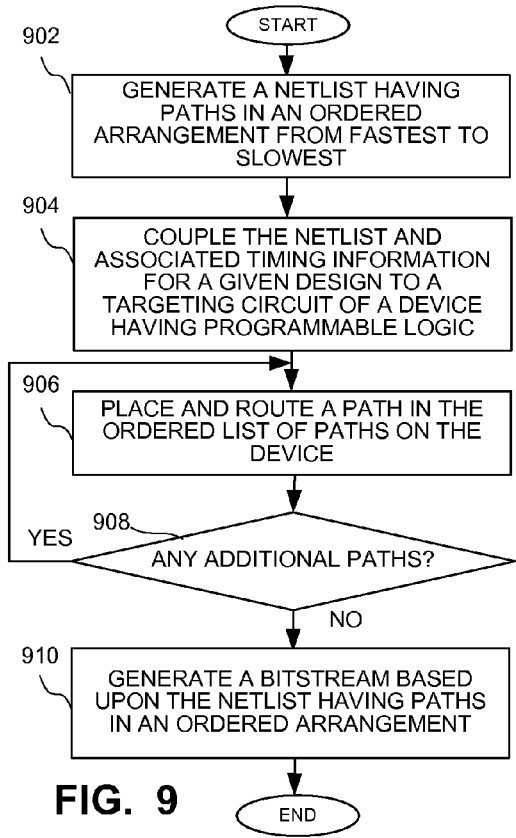
FIG. 9 is a flow chart showing a method of performing a place and route of a netlist by a device having programmable logic according to an embodiment the present invention.

While the information provided with the netlist to the device may vary, certain steps may be implemented to enable successfully placing and routing the design in the device. The flow chart of FIG. 9 shows a method of performing a place and route of a netlist having an ordered list of paths of the design by a device having programmable logic. Accordingly, a netlist having paths in an ordered arrangement from fastest to slowest is provided at a step 902. In addition to being ordered, the netlist may include other information, such as timing or location information, to enable successfully placing and routing the design by the targeting circuit of the device. The netlist having ordered paths and other information is received at the targeting circuit of a device at a step 904. A path in the ordered list of paths is placed and routed on the device at a step 906. It is then determined whether any additional paths need to be routed at a step 908. If additional paths need to be placed and routed, those paths are placed and routed with any remaining resources of the device which will enable the paths to meet any timing requirements for the path. For example, a re-targeting function using a circuit of the device may comprise placing elements of paths having fast timing requirements close to each other. Finally, a bitstream based upon the netlist having paths in an ordered arrangement is generated at a step 910.

Figure 10:
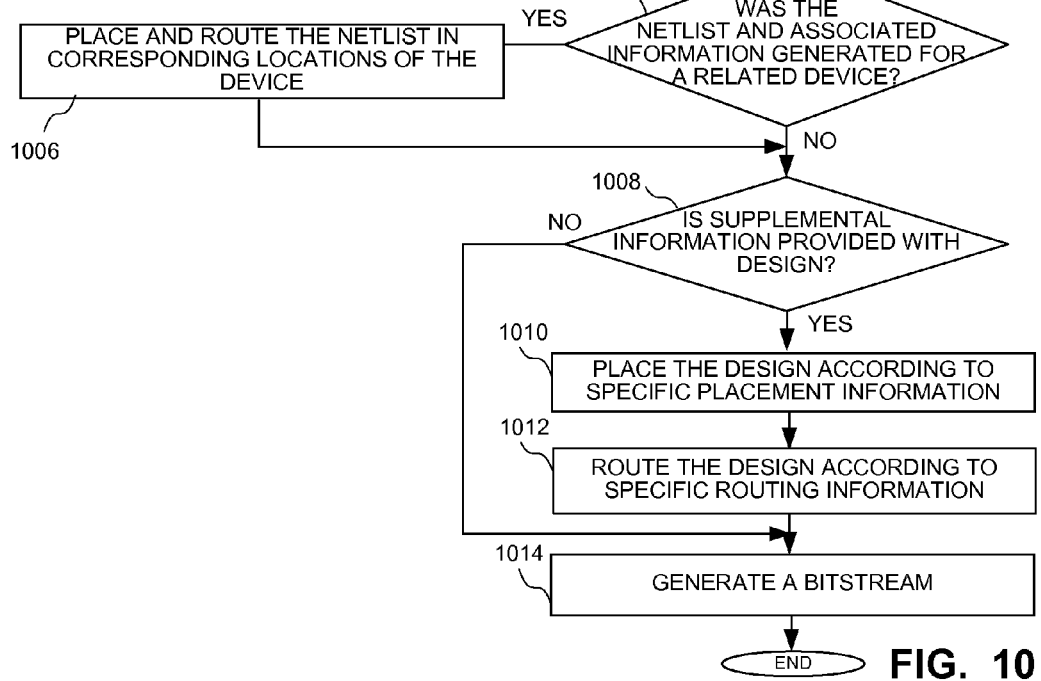
FIG. 10 is a flow chart showing a method of performing a place and route using supplemental information according to an embodiment the present invention.

As set forth above, information related to the device for which a netlist is generated will be provided to the device implementing the design, thereby enabling the targeting circuit such as a place and route tool of the device to make placement and routing decisions to successfully implement the design. The flow chart of FIG. 10 shows a method of performing a placement and routing of a design, where the designation of the device for which a netlist was originally generated is used by place and route tool of the device to more effectively place and route the design. A netlist having at least device information is received at a step 1002. It is then determined whether the device for which the netlist was created and the device which will implement the design are related at a step 1004. If so, the netlist is placed and routed in corresponding locations of the device at a step 1006. That is, the place and route tool will place and route various nets and paths using similar resources of the related devices. It is then determined whether supplemental information is provided with the design at a step 1008. For example, the supplemental information may include other location or timing information. Accordingly, if additional information is available, the place and route tool may use the additional information to make further placement and routing decisions. For example, the design is placed according to specific placement information at a step 1010 and routed according to specific routing information at a step 1012. A bitstream is then generated at a step 1014.

The methods of the present invention may be performed to enable the use of an annotated netlist for a given design and device to be implemented on a different device. As will be described in more detail below, the different device may be different devices of a given family, such as Virtex-4 FPGA devices having different sized, or different families of devices, such as Virtex-4 and Virtex-5 families of devices, available from Xilinx, Inc. By way of example, the Virtex-4 architecture implements general logic with 4-input LUTs, while the Virtex-5 architecture implements logic in 6-input LUTs. A 6-input LUT can implement any function that a 4-input LUT can implement. Further, Virtex-4 wiring has length-6 segments for connecting logic blocks, while Virtex-5 does not have length-6 wires, but length-5 wires instead. An initial targeting of the design may comprise a pre-placement and routing for a Virtex-4 device with 4-input LUTs and length-6 wires. Steps in pre-placement and routing may include mapping, packing, placement and routing for Virtex-4; annotating the netlist with "Virtex-4"; annotating each logic block with the x, y location of the CLB where it was placed and the slot in the CLB; and annotating each net with a delay and one wiring segment it used. The netlist may also be annotated with the Virtex-4 configuration bitstream. That is, if the target device is compatible with the device for which the netlist was generated, it may be possible to use the actual bitstream, as will be described in more detail below in reference to FIG. 13.

After the complete annotated netlist is sent to the device, a re-targeting function is performed. A re-targeting function, which may comprise a second placement and routing function on the receiving device, depends on the bitstream which is received. If the incoming design is pre-placed for a Virtex-4 device and the netlist is annotated with the bitstream, a Virtex-4 device will use the bitstream. If the incoming design is pre-placed for a Virtex-4 device but the bitstream is incompatible, then each logic element is assigned to its position in the annotated netlist. If there is no CLB at a location indicated by the annotated netlist, a search for the nearest compatible resource is performed. The annotated nets of the netlist are also used for routing. If the delay is not acceptable, alternate paths will be retried until an acceptable path is found. When the annotated netlist is downloaded to a Virtex-5 device, the targeting circuit of the Virtex-5 device will discover that the bitstream cannot be used. Accordingly, a second placement by the targeting circuit of the Virtex-5 device uses the annotated locations, leaving LUT inputs 5 and 6 tied to logic zero. If a CLB cannot contain all the logic assigned to it or if there is no CLB at a location indicated in the annotated netlist, a search for the nearest compatible resource is performed. The net annotations may also be used for routing. When the annotation requests a length-6 line, the targeting circuit of the Virtex-5 device will attempt to route using a length-5 line. If routing using a length-5 line does not work, any resource may be used for routing. If the net delay is not acceptable, alternate paths will be retried until the delay is acceptable.

Figure 11:
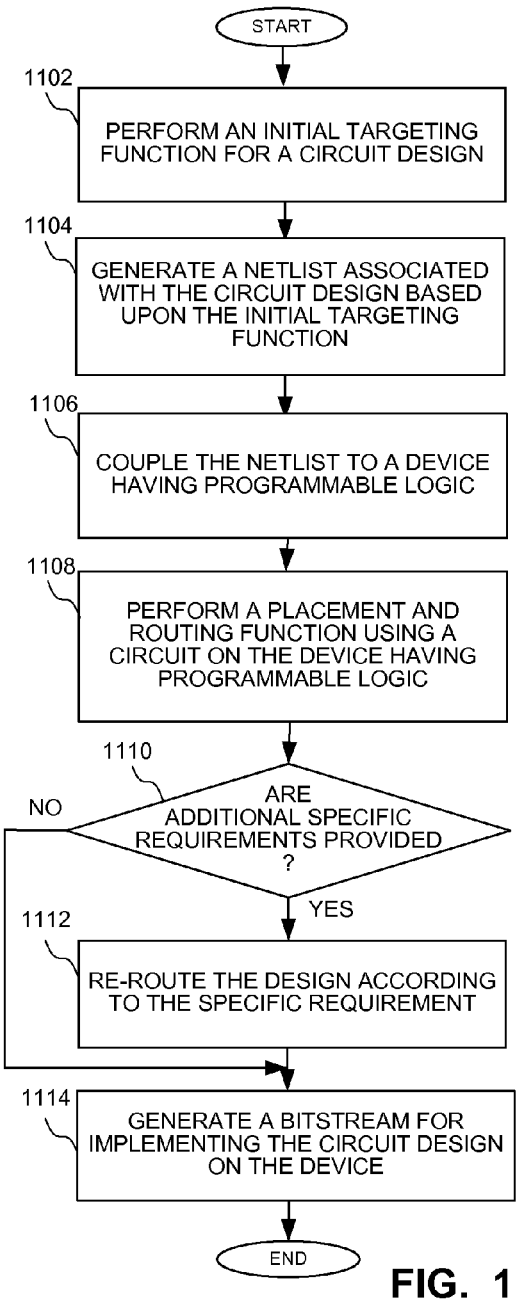
FIG. 11 is a flow chart showing a method of re-routing a netlist by a device having programmable logic according to an embodiment the present invention.

While the two stages of placement and routing enables the use of a given netlist for a design to be used with different devices, the second placement and routing function may also be used to meet specific requirements of the device in which the netlist is being implemented. The flow chart of FIG. 11 shows a method of re-routing a netlist by a device having programmable logic according to an embodiment the present invention. After an initial targeting function is performed for a circuit design at a step 1102, a netlist associated with the circuit design is generated based upon the initial targeting function at a step 1104. The netlist is coupled to the device having programmable logic at a step 1106. A re-targeting function comprising a second placement and routing function is performed using a circuit on the device having programmable logic at a step 1108. While the second placement and routing takes into account any information provided with the netlist as set forth above, it is then determined whether there are additional specific requirements provided at a step 1110. If so, the design is re-routed according to the specific requirement at a step 1112. By way of example, an additional requirement of a design may be a power optimization requirement, where the device may need to be re-routed to reduce power while still meeting timing requirements for example. While the design is implemented based upon information received with a netlist and then re-routed, the design may be implemented based upon specific requirements for the device in which the design is implemented, and then re-routed to take into account the information provided with the netlist. Alternatively, the place and route tool could simultaneously use both the information provided with the netlist and the additional requirements to place and route the design. Finally, a bitstream is generated for implementing the circuit design on the device at a step 1114.

Figure 12:
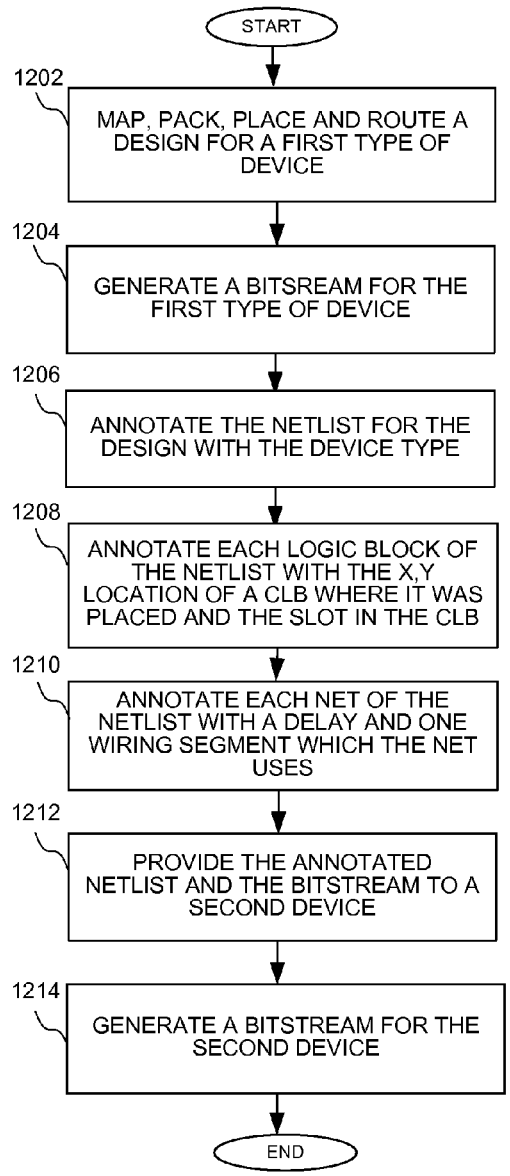
FIG. 12 is a flow chart showing a method of performing an initial targeting function according to an embodiment of the present invention.

Turning now to FIG. 12, a flow chart shows a method of performing an initial targeting function according to an embodiment of the present invention. A design is mapped, packed, placed and routed for a first type of device at a step 1202. A bitstream is generated for the first type of device at a step 1204. A netlist for the design is annotated with the device type at a step 1206. Each logic block of the netlist is annotated with the x,y location of a CLB where it was placed and the slot in the CLB at a step 1208. Each net of the netlist is annotated with a delay and one wiring segment which the net uses at a step 1210. The annotated netlist and the bitstream are provided to a second type of device at a step 1212. Finally, a bitstream for the second type of device is generated at a step 1214. As will be described in more detail in reference to FIG. 13, the bitstream and the annotated netlist may be used to implement the circuit according to the bitstream for the second type of device.

Figure 13:
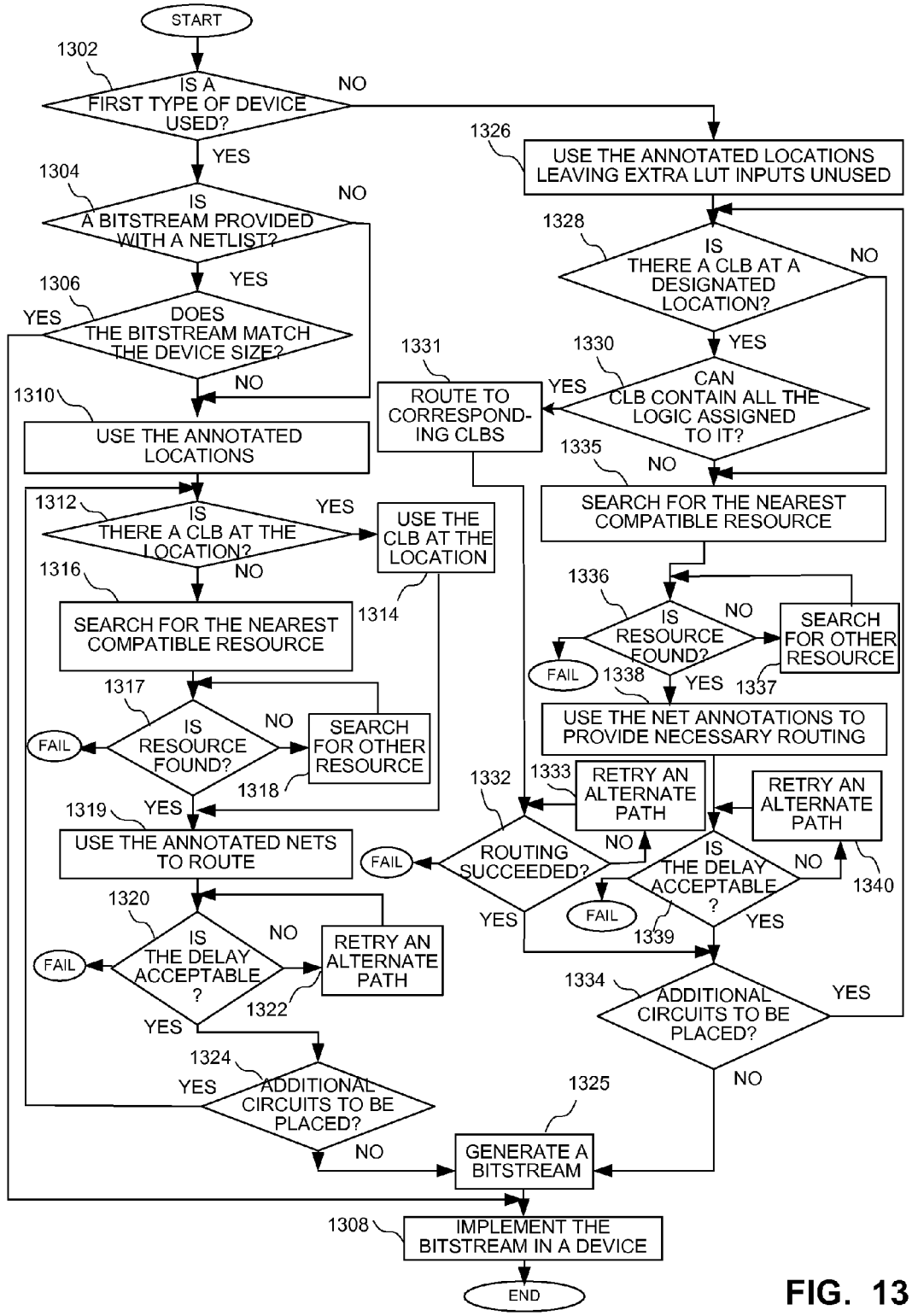
FIG. 13 is a flow chart showing a method of re-targeting a design by a circuit of a device having programmable logic according to an embodiment of the present invention.

Turning now to FIG. 13, a flow chart shows a method of re-targeting a design by a circuit of a device having programmable logic according to an embodiment of the present invention. It is first determined whether a first type of device is used at a step 1302. If so, it is determined whether a bitstream is provided with a netlist at a step 1304. If a bitstream is provided with the netlist, it is determined whether the bitstream matches the device size at a step 1306. If so, the circuit will implement the bitstream at a step 1308. If the bitstream does not match the device size, the annotated locations are used at a step 1310. That is, the design will be re-targeted by a circuit of the device based upon compatibility information of the devices, where each logic block of the design may have a preferred location to be placed and each net of the design may have a preferred path to be routed. For example, a certain portion of logic may be placed in a CLB at a preferred location. It is then determined if there a CLB at a required location at a step 1312. If so, the CLB at the location is used at a step 1314. If there is no CLB at the location, the placement and routing tool of the device searches for the nearest compatible resource at a step 1316. It is then determined whether a resource is found at a step 1317. If not, there will be another search for a resource at a step 1318. The search for another resource will be performed a predetermined number of times, after which the attempt to locate a compatible resource will fail and the process of generating a bitstream will end. The annotated nets are then used for routing at a step 1319. It is then determined whether the delay is acceptable at a step 1320. If not, an alternate path is retried at a step 1322. The attempt to determine whether a path provides an acceptable delay will also be performed a predetermined number of times, after which the attempt to retry a path will fail and the process of generating a bitstream will end. Finally, it is determined if additional circuits are to be placed at a step 1324. If so, the placement and routing tool will again determine if there is a CLB at a designated location at the step 1312. If no additional resources are to be placed, a bitstream will be generated at a step 1325, and will be implemented in the device at the step 1308.

If the device is not a first type of device at the step 1302, and therefore any bitstream provided with the device could not be used, the annotated locations are used, wherein extra LUT inputs are left unused at a step 1326. In using the annotations, it is determined if there is a CLB at a designated location at a step 1328. If so, it is determined whether the CLB can contain all the logic assigned to it at a step 1330. If so, the logic is routed to corresponding CLBs at a step 1331. It will then be determined whether the routing succeeded at a step 1332. If not, an alternate path will be tried at a step 1333. The attempts to retry an alternate path will be performed a predetermined number of times, after which the attempt to retry a path will fail and the process of generating a bitstream will end. If the routing succeeded, it will then be determined whether additional circuits are to be placed at a step 1334. If not, the bitstream is generated at the step 1325. If additional circuits are to be placed, it is then determined if there is a CLB at a designated location at the step 1328.

If the CLB cannot contain all the logic assigned to it at the step 1330, a search is performed for the nearest compatible resource at a step 1335. It is then determined whether a resource is found at a step 1336. If not, there will be another search for a resource at a step 1337. The search for another resource will be performed a predetermined number of times, after which the attempt to locate a compatible resource will fail and the process of generating a bitstream will end. The net annotations are used to provide necessary routing at a step 1338. It is then determined whether the delay is acceptable at a step 1339. If not, an alternate path is retried at a step 1340. The search for a path having an acceptable delay will be performed a predetermined number of times, after which the attempt to locate a path will fail and the process of generating a bitstream will end. If additional circuits are to be placed at a step 1334, it is again determined whether there is a CLB at a designated location at the step 1328. The methods of FIGS. 7-13 may performed using any of the circuits of FIGS. 1-6 as described above, or any other suitable circuit.

It can therefore be appreciated that the new and novel method of implementing a device having programmable logic has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of configuring a device having programmable resources, the method comprising:
generating a netlist associated with a circuit design;
wherein the generating of the netlist includes:
performing a first placing and routing of the netlist according to a first type of device;
annotating logic blocks in the netlist with data indicating locations of programmable resources on which the logic blocks are placed according to the first placing and routing; and
generating a first bitstream for a first type device from the annotated netlist;
loading the annotated netlist to the device having programmable resources;
determining a type of the device;
in response to the device being of a second type different from the first type, performing a second placing and routing of the annotated netlist using a circuit on the device, the second placing and routing targeting the device of the second type;
generating, by the device, a second configuration bitstream from the second placing and routing; and
configuring the programmable resources to implement the circuit design according to the second configuration bitstream.

2. The method of claim 1 wherein loading the netlist comprises loading information from the group consisting of timing information related to nets of the circuit design, timing information related to paths of the circuit design, and location information.

3. The method of claim 1 wherein loading the netlist comprises loading the netlist associated with logic blocks comprising at least one logic block from the group consisting of:
lookup tables;
flip flops;
configurable logic blocks; and
random access memories.

4. The method of claim 1 wherein loading the netlist comprises loading the netlist having compatibility information, wherein each logic block of the circuit design has a preferred location.

5. The method of claim 1 wherein loading the netlist comprises loading the netlist having compatibility information, wherein each net of the circuit design has a preferred path.

6. A method of configuring a device having programmable resources, the method comprising:
performing a first placing and routing of a netlist of a circuit design targeted to a first type of device;
annotating logic blocks in the netlist with data indicating locations of programmable resources on which logic blocks of the circuit design are placed according to the first placing and routing;
loading the annotated netlist to the device having programmable resources;
determining a type of the device;
in response to the device being of a second type different from the first type, performing a second placing and routing of the annotated netlist using a circuit on the device; and
configuring the programmable resources to implement the circuit design based upon results of the second placing and routing.

7. The method of claim 6 wherein performing the second placing and routing using a circuit of the device comprises routing faster paths before routing slower paths.

8. The method of claim 6 wherein performing the second placing and routing using a circuit of the device comprises placing elements of paths having fast timing requirements close to each other.

9. The method of claim 6 wherein loading the annotated netlist comprises loading the netlist having compatibility information, wherein each logic block of the circuit design has a preferred location and each net of the circuit design has a preferred path.

10. The method of claim 6 wherein loading the annotated netlist comprises loading the netlist having timing information related to nets of the design.

11. The method of claim 6 wherein loading the annotated netlist comprises loading the netlist having timing information related to paths of the design.

12. A device having programmable resources, the device comprising:
an input/output port coupled to receive an annotated netlist associated with a circuit design;

wherein data in the annotated netlist indicate locations of programmable resources on which logic blocks of the circuit design are placed according to a first placement and routing targeted to a first type of device;
a plurality of programmable blocks; and
a targeting circuit coupled to the input/output port and to the programmable blocks, wherein the targeting circuit is configured to:
receive the annotated netlist;
determine a type of the device;
in response to the device being of a second type different from the first type, performing a second placing and routing of the annotated netlist; and
implement the circuit design using the programmable blocks according to the second placing and routing of the annotated netlist.

13. The device of claim 12 wherein the plurality of programmable blocks comprises at least one programmable block from the group consisting of:
lookup tables;
flip flops;
configurable logic blocks; and
random access memories.

14. The device of claim 12 wherein the netlist comprises a netlist annotated with routing information.

15. The device of claim 12 wherein the netlist comprises a netlist annotated with timing information related to nets of the design.

16. The device of claim 12 wherein the netlist comprises a netlist annotated with timing information related to paths of the design.

* * * * *